(12) United States Patent
Nakamura et al.

(10) Patent No.: US 12,382,836 B2
(45) Date of Patent: Aug. 5, 2025

(54) PIEZOELECTRIC DEVICE AND METHOD OF MANUFACTURING THE SAME

(71) Applicant: Nitto Denko Corporation, Ibaraki (JP)

(72) Inventors: Daisuke Nakamura, Ibaraki (JP); Naoki Nagaoka, Ibaraki (JP); Manami Kurose, Ibaraki (JP); Hironobu Machinaga, Ibaraki (JP); Taketo Ishikawa, Ibaraki (JP); Takahiko Yanagitani, Tokyo (JP); Takahiro Shimizu, Tokyo (JP)

(73) Assignee: NITTO DENKO CORPORATION, Ibaraki (JP)

( * ) Notice: Subject to any disclaimer, the term of this patent is extended or adjusted under 35 U.S.C. 154(b) by 996 days.

(21) Appl. No.: 17/279,054

(22) PCT Filed: Sep. 27, 2019

(86) PCT No.: PCT/JP2019/038291
§ 371 (c)(1),
(2) Date: Mar. 23, 2021

(87) PCT Pub. No.: WO2020/067483
PCT Pub. Date: Apr. 2, 2020

(65) Prior Publication Data
US 2022/0085274 A1    Mar. 17, 2022

(30) Foreign Application Priority Data

Sep. 28, 2018 (JP) .................................. 2018-185549
Sep. 26, 2019 (JP) .................................. 2019-176135

(51) Int. Cl.
*H01L 41/053* (2006.01)
*C04B 35/453* (2006.01)
(Continued)

(52) U.S. Cl.
CPC ......... *H10N 30/853* (2023.02); *C04B 35/453* (2013.01); *C04B 35/62222* (2013.01);
(Continued)

(58) Field of Classification Search
CPC ....................... H10N 30/853; H10N 30/10516
(Continued)

(56) References Cited

U.S. PATENT DOCUMENTS 4,336,120 A    6/1982 Sakakura et al.
7,105,880 B2   9/2006 Noguchi et al.
(Continued)

FOREIGN PATENT DOCUMENTS

CN    1665043 A      9/2005
EP    3 605 627 A1   2/2020
(Continued)

OTHER PUBLICATIONS

Office Action issued for corresponding Japanese Patent Application No. 2019-176135 on Sep. 21, 2021, along with an English machine translation.
(Continued)

*Primary Examiner* — Derek J Rosenau
(74) *Attorney, Agent, or Firm* — Hauptman Ham, LLP

(57) ABSTRACT

A piezoelectric device having a high conversion efficiency between electrical energy and mechanical energy is provided. The piezoelectric device has first electrode, a second electrode, and a piezoelectric layer provided between the first electrode and the second electrode, wherein the piezoelectric layer is formed of a ZnO-based material having a wurtzite crystal structure to which a metal that does not cause the piezoelectric layer to exhibit conductivity is added, and wherein a squared value of a electromechanical coupling coefficient in thickness vibration mode is 6.5% or more.

29 Claims, 5 Drawing Sheets

(51) Int. Cl.
*C04B 35/622* (2006.01)
*H10N 30/00* (2023.01)
*H10N 30/076* (2023.01)
*H10N 30/853* (2023.01)

(52) U.S. Cl.
CPC ......... *H10N 30/076* (2023.02); *H10N 30/708* (2024.05); *C04B 2235/3206* (2013.01); *C04B 2235/3208* (2013.01); *C04B 2235/3284* (2013.01)

(58) Field of Classification Search
USPC ............... 310/358; 252/62.9 R, 62.9 PZ
See application file for complete search history.

(56) References Cited

U.S. PATENT DOCUMENTS

| | | | |
|---|---|---|---|
| 2003/0129307 A1* | 7/2003 | Lu | C30B 29/16 427/255.28 |
| 2004/0135144 A1 | 7/2004 | Yamada et al. | |
| 2005/0184627 A1* | 8/2005 | Sano | H03H 9/174 310/363 |
| 2005/0194626 A1 | 9/2005 | Noguchi et al. | |
| 2006/0001508 A1 | 1/2006 | Ohara et al. | |
| 2007/0126313 A1* | 6/2007 | Ueno | H10N 30/10516 310/311 |
| 2017/0207383 A1* | 7/2017 | Xiong | H10N 30/871 |
| 2017/0257076 A1* | 9/2017 | Kaneko | H03H 9/175 |
| 2020/0381610 A1 | 12/2020 | Arimoto et al. | |

FOREIGN PATENT DOCUMENTS

| | | |
|---|---|---|
| JP | H8-310813 A | 11/1996 |
| JP | 2005-252069 A | 9/2005 |
| JP | 2005-303573 A | 10/2005 |
| JP | 2006-19935 A | 1/2006 |
| JP | 2008-211095 A | 9/2008 |
| JP | 2011-134787 A | 7/2011 |
| JP | 2014-229690 A | 12/2014 |
| JP | 6273691 B2 | 2/2018 |
| JP | 2018-170503 A | 11/2018 |

OTHER PUBLICATIONS

Office Action issued on Dec. 4, 2023 for corresponding Chinese Patent Application No. 201980062655.2, along with an English translation (20 pages).

Li et al., "Fabrication and Characterization of a Zinc-Oxide-Based Film Bulk Acoustic Wave Resonator", Micronanoelectronic Technology, vol. 53, No. 11, Nov. 2016, pp. 726-730 (5 pages), with English Abstract.

Extended European Search Report issued on Sep. 23, 2022, for corresponding European Patent Application No. 19864588.9 (11 pages).

Liu Y et al., "Solidly mounted resonators fabricated for GHz frequency applications based on MgxZn1—xO piezoelectric film", Vacuum, vol. 141, Apr. 14, 2017, pp. 254-258.

Chen Y et al., "Multifunctional ZnO-Based Thin-Film Bulk Acoustic Resonator for Biosensors", Journal of Electronic Materials, vol. 38, No. 8, Apr. 25, 2009, pp. 1605-1611.

Dhananjay et al., "Dielectric properties of c-axis oriented Zn1—xMgxO thin films grown by multimagnetron sputtering", Applied Physics Letters, vol. 89, 082905, Aug. 23, 2006 (3 pages).

Water W et al., "The influence of calcium doped ZnO films on Love wave sensor characteristics", Sensors and Actuators A, vol. 127, No. 2, Jan. 18, 2006, pp. 360-365.

International Search Report issued for corresponding International Patent Application No. PCT/JP2019/038291 on Nov. 26, 2019, along with an English translation.

Written Opinion issued for corresponding International Patent Application No. PCT/JP2019/038291 on Nov. 26, 2019.

Office Action issued Jan. 29, 2024 for corresponding Korean Patent Application No. 10-2021-7008854, along with an English machine translation (8 pages).

Office Action issued on Dec. 21, 2021 for corresponding Japanese Patent Application No. 2019-176135, along with an English machine translation.

Office Action issued on Jul. 19, 2023 for corresponding Korean Patent Application No. 10-2021-7008854, along with an English translation (19 pages).

Chinese Office Action issued on Apr. 13, 2024, in connection with the corresponding Chinese Patent Application No. 201980062655.2, with an English translation, 28 pages.

Xixin Qu, "Film Physics", Shanghai Scientific and Technical Press, Oct. 1986, with an English abstract, 8 pages.

Guoping Chen, "Physics and Technology of Film", Dongnan University Press, May 1993, with an English abstract, 5 pages.

Office Action issued on Oct. 11, 2024 for corresponding Chinese Patent Application No. 201980062655.2, along with an English machine translation (20 pages).

Fu et al., "Advances in piezoelectric thin films for acoustic biosensors, acoustofluidics and lab-on-chip applications", Progress in Materials Science vol. 89, Aug. 2017, pp. 31-91 (62 pages).

* cited by examiner

FIG.4A

Mg-DOPED MATERIAL

| | Amount of Dopant [atom%] | $k_t^2$ |
|---|---|---|
| Pure ZnO | – | 5.9% |
| MgZnO | 10 | 7.3% |
| | 15 | 7.8% |
| | 25 | 7.3% |

FIG.4B

Mg-DOPED MATERIAL

| | Amount of Dopant (Preparation) [atom%] | Mg Content in Film (Film Composition) [atom%] | XRC-FWHM | $k_t^2$ |
|---|---|---|---|---|
| Pure ZnO | – | – | 4.5° | 5.9% |
| MgZnO | 5 | 2.5 | 2.9° | 6.0% |
| | 10 | 4.4 | 2.0° | 7.3% |
| | 15 | 6.4 | 2.1° | 7.8% |
| | 20 | 8.3 | 2.6° | 7.3% |
| | 25 | 10.3 | 1.7° | 7.3% |
| | 35 | 14.2 | 1.5° | 8.1% |
| | 50 | 20.0 | 3.1° | 8.4% |

FIG.5

Ca-DOPED MATERIAL

| | Ca Content in Film (Film Composition) [atom%] | XRC-FWHM | $k_t^2$ |
|---|---|---|---|
| Pure ZnO | - | 4.5° | 5.9% |
| CaZnO | 0.4 | 4.7° | 5.8% |
| | 0.9 | 2.7° | 6.8% |
| | 1.1 | 2.1° | 6.9% |
| | 1.7 | 1.8° | 6.9% |
| | 1.8 | 3.0° | 6.5% |
| | 3.5 | 2.0° | 6.3% |
| | 5.1 | 2.6° | 5.5% |
| | 10.0 | 4.0° | 5.4% |

PIEZOELECTRIC DEVICE AND METHOD OF MANUFACTURING THE SAME

CROSS REFERENCE TO RELATED APPLICATIONS

This application is a National Stage of International Application No. PCT/JP2019/038291, filed on Sep. 27, 2019, which designates the United States and was published in Japan, and which claims priority to Japanese Patent Application Nos. 1) 2018-185549, filed on Sep. 28, 2018; and 2) 2019-176135, filed on Sep. 26, 2019 in the Japan Patent Office. All of the aforementioned applications are hereby incorporated by reference in their entireties.

TECHNICAL FIELD

The present invention relates to a piezoelectric device and a method of manufacturing the same.

BACKGROUND ART

Piezoelectric devices, which make use of the piezoelectric effect of substances, have conventionally been adopted. The piezoelectric effect is a phenomenon in which microscopic polarization is produced in response to a mechanical stress applied to a substance. Using the piezoelectric effect, various sensors including pressure sensors, acceleration sensors, and acoustic emission (AE) sensors for detecting elastic waves are commercially available.

In recent years, touch panels have been used as input interfaces of electronic devices such as smartphones, and piezoelectric devices are often applied to the touch panels. A touch panel is integrated into the display device of electronic equipment. In this case, it would be necessary to the piezoelectric layer to be highly responsive to pressure in order to accurately detect manipulations by a finger. Applications to biological sensors are also expected to detect biological signals such as pulse rate or respiratory rate. High sensitivity is again required for such applications.

A sintered film of a piezoelectric material is known, where a chemical solution containing a compound with a wurtzite crystal structure to which an alkaline earth metal such as magnesium (Mg), calcium (Ca) or the like is added is applied by a sol-gel process and sintered. (See, for example, Patent Document 1 presented below).

Another conventional technique is to apply a paste of a mixture of MgO and varnish onto an oriented ZnO film formed by a vapor transport method, and to diffuse Mg into the oriented ZnO film by thermal diffusion. (See, for example, Patent Document 2 presented below). In this method, the paste is applied such that the weight ratio of MgO to the oriented ZnO becomes 0.05 to 2.0 wt %.

SUMMARY OF THE INVENTION

Technical Problem to be Solved

In general, a piezoelectric device has a structure in which a piezoelectric layer is sandwiched between a pair of electrodes. With this configuration, it is desired to efficiently convert the vibration in the thickness direction of the piezoelectric layer into electrical energy, or conversely, to efficiently convert the applied electrical energy into mechanical deformation. One of the objectives of the present invention is to provide a piezoelectric device having a satisfactory mechanical/electric conversion efficiency and a method of manufacturing the same.

Technical Solution(s)

In the present invention, a piezoelectric device having a high conversion ability between electrical energy and mechanical energy is provided by adding a predetermined amount of metal to the piezoelectric layer.

In one aspect of the invention, a piezoelectric device has first electrode, a second electrode, and a piezoelectric layer provided between the first electrode and the second electrode, wherein the piezoelectric layer is formed of a ZnO-based material having a wurtzite crystal structure to which a metal that does not cause the piezoelectric layer to exhibit conductivity is added, and wherein a squared value of a electromechanical coupling coefficient in thickness vibration mode is 6.5% or more.

In another aspect of the invention, a piezoelectric device has first electrode, a second electrode, and a piezoelectric layer provided between the first electrode and the second electrode, wherein the piezoelectric layer is formed of a ZnO-based material having a wurtzite crystal structure to which Mg is added, and wherein a Mg content with respect to a total amount of Zn and Mg is 4 atom % to 30 atom %.

In still another aspect of the invention, a piezoelectric device has first electrode, a second electrode, and a piezoelectric layer provided between the first electrode and the second electrode, wherein the piezoelectric layer is formed of a ZnO-based material having a wurtzite crystal structure to which Ca is added, and wherein a Ca content with respect to a total amount of Zn and Ca is 0.5 atom % to 5 atom %.

Advantageous Effect of the Invention

With an above-described configuration, a piezoelectric device having a high conversion efficiency between electrical energy and mechanical energy is provided.

BRIEF DESCRIPTION OF DRAWINGS

FIG. 4A shows electromechanical coupling coefficients (squared values) of Mg-doped piezoelectric materials, compared with a piezoelectric material without metal additive;

FIG. 4B shows full width at half maximum (FWHM) values acquired by an X-ray locking curve method and squared values of electromechanical coupling coefficient of Mg-doped piezoelectric materials, compared with a piezoelectric material without metal additive;

FIG. 5 shows FWHM values acquired by an X-ray locking curve method and squared values of electromechanical coupling coefficient of Ca-doped piezoelectric materials, compared with a piezoelectric material without metal additive;

DESCRIPTION OF PREFERRED EMBODIMENTS

Figure 1:
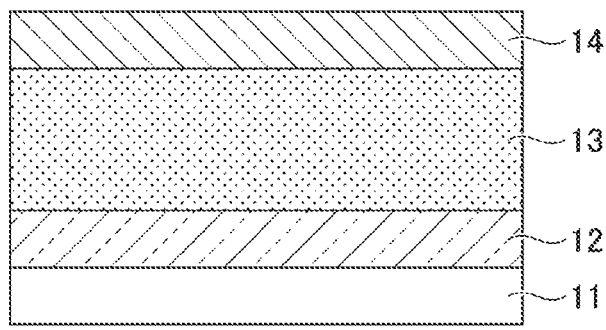
FIG. 1 is a schematic diagram of a piezoelectric device according to an embodiment.

FIG. 1 is a schematic diagram of a piezoelectric device 10A. The piezoelectric device 10A may be used as a piezoelectric sensor that produces an electric signal proportional to an externally applied pressure.

The piezoelectric device 10A has a structure in which a first electrode 12, a piezoelectric layer 13, and a second electrode 14 are stacked in this order on a substrate 11. In the embodiment, the piezoelectric layer 13 has a wurtzite crystal structure doped with a predetermined amount of a metal.

For the substrate 11, any suitable material such as a glass, a plastic, or a ceramic may be used. When a plastic substrate is used, a flexible substrate that can impart flexibility to the piezoelectric device 10A may be used. Such a plastic substrate includes, but is not limited to polyethylene terephthalate (PET), polyethylene naphthalate (PEN), polycarbonate (PC), acrylic resin, cycloolefin polymer, polyimide (PI), and so on.

Among these materials, PET, PEN, PC, acrylic resin, and cycloolefin polymer are colorless and transparent materials, and suitably used when light transmission is required for the piezoelectric device 10A. When light transmission is not essential for the piezoelectric device 10A, for example, in applications to healthcare products including a pulse rate monitor and or a heart rate monitor, or to pressure sensor sheets for vehicles, a semitransparent or opaque plastic material may be used.

For the first electrode 12, any conductive material can be used. In applications that require light transmission, a transparent oxide conductive film such as indium tin oxide (ITO), indium zinc oxide (IZO), indium zinc tin oxide (IZTO), indium gallium zinc oxide (IGZO), or the like may be used. When transparency is not required, a good conductor or a metal such as Au, Pt, Ag, Ti, Al, Mo, Ru, or Cu may be used.

From the viewpoint of suppressing roughness or crystal grain boundary at the interface between the first electrode 12 and the piezoelectric layer 13, the oxide conductor film used for the electrode may be an amorphous film. By using an amorphous film, the surface roughness or crystal grain boundaries of the first electrode 12, which may cause leakage current paths, can be reduced. Besides, the piezoelectric layer 13 can grow with a good crystal orientation on the first electrode 12, with less influence from the crystal orientation of the underlaid first electrode 12.

The piezoelectric layer 13 is made of an inorganic piezoelectric material which has, for example, a wurtzite crystal structure. The thickness of the piezoelectric layer 13 is not particularly limited; however, the thickness may be 50 nm or more. When the thickness of the piezoelectric layer 13 is less than 50 nm, it may be difficult to exhibit sufficient piezoelectric characteristics (or polarization proportional to applied stress).

Wurtzite crystal has a hexagonal unit cell and its polarization vector is parallel to the c-axis. Wurtzite piezoelectric materials include, but are not limited to zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), silicon carbide (SiC), etc. Among these materials, only a single component may be used, or a combination of two or more components may be used. When two or more components are combined, the respective layers of the selected components may be stacked one by one. Such a single component or a combination of two or more components selected from the above-describe group may be used as the main component, and some other substance(s) may be optionally added as subcomponent(s) to the main component.

When ZnO, ZnS, ZnSe, and ZnTe are used as the wurtzite crystal, an alkaline earth metal such as Mg, Ca, Sr, V, Ti, Zr, or Li may be added at a predetermined ratio. These elements do not cause the piezoelectric layer to exhibit conductivity even when these elements enter the Zn site of the wurtzite crystal, and rather, these elements improve the value of the electromechanical coupling coefficient.

When ZnO is used as the wurtzite crystal, and when Mg is added as the metal dopant, the amount of Mg with respect to the total amount of Zn and Mg is preferably 5 atom % to 30 atom %, and more preferably 10 atom % to 25 atom %. When Ca is added as an alkaline earth metal, the amount of Ca with respect to the total amount of Zn and Ca is preferably 0.5 atom % to 5 atom %, more preferably 0.8 atom % to 2.0 atom %, and even more preferably 0.9 atom % to 1.8 atom %.

The second electrode 14 can be formed of any conductive material. When the piezoelectric device 10A requires light transmission, the second electrode 12 may be a transparent oxide conductive film such as ITO, IZO, IZTO, or IGZO. When light transmission is not required, a metal electrode may be made of a good conductor such as Au, Pt, Ag, Ti, Al, Mo, Ru, Cu, etc.

Figure 2:
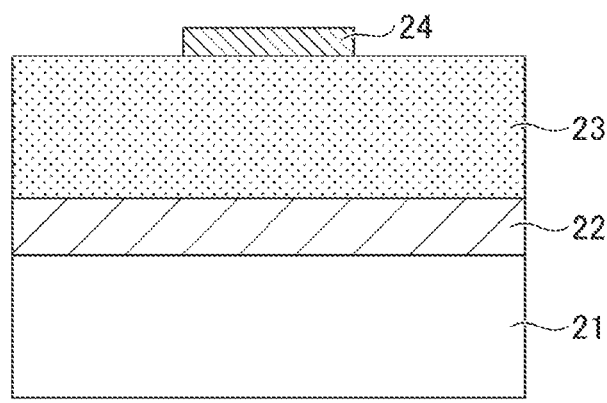
FIG. 2 is a schematic diagram of a sample for testing piezoelectric characteristics.

FIG. 2 is a schematic diagram of a sample 20 prepared for evaluation of the characteristics of the piezoelectric device of the embodiment. In the sample 20, a Ti film 22 with a thickness of 200 nm is formed by DC sputtering on the substrate 21 of a quartz glass. Then, a ZnO piezoelectric layer 23 with a thickness of 6 μm is formed by RF magnetron sputtering on the Ti film 22. Multiple samples 20 are prepared by changing the material and the amount of dopant added to the ZnO piezoelectric layer 23. Then, Au film 24 with a thickness of 200 nm is provided as a top electrode on the piezoelectric layer 23.

The samples 20 having ZnO piezoelectric layers 23 with different dopants added, each dopant being added at different ratios, are fabricated in the same size under the same conditions (except for the material and the amounts of dopants added). As a reference, a sample of a ZnO layer without dopant added (which may be called "pure-ZnO") is also prepared.

When Mg is used as the dopant, the content of Mg added to the piezoelectric layer is varied as described below. When Ca is used as the dopant, the Ca content in the piezoelectric layer is also varied within a predetermined range.

When Mg is added, a ZnO sintered target to which a predetermined ratio of MgO has been added in advance may be used for sputtering, or alternatively, a ZnO target and an MgO target may be used in a multi-element sputtering system for simultaneously and independently sputtering ZnO and MgO to carry out film formation at a desired doping ratio. When Ca is added, a ZnO sintered target to which a predetermined ratio of CaO has been added in advance may be used for sputtering, or alternatively, a ZnO target and a CaO target may be used in a multi-element sputtering system for simultaneously and independently sputtering ZnO and CaO to carry out film formation at a desired doping ratio.

The composition ratio of each of the samples is evaluated using Quantum 2000, which is an instrument for electron spectroscopy for chemical analysis (ESCA) manufactured by ULVAC-PHI, Inc. Particularly, the piezoelectric layer 23 is irradiated with X-rays emitted from a monochrome Al Kα radiation source at 15 kV and 30 W for analysis. Further, composition analysis is performed up to the depth of 200 nm, while etching the layer by Ar ion beams of acceleration voltage of 2 kV, and the average value thereof is used as the film composition ratio (or contents ratio) of the fabricated film.

In the evaluation test, an AC voltage is applied to each sample 20 using a network analyzer (manufactured by Agilent Technologies, Inc.), and conversion loss of the piezoelectric layer 23 is measured. Specifically, the tip of the probe connected to the terminal of the network analyzer is pressed against the Au film 24 provided onto the top surface of the sample 20 to apply an AC voltage, and the conversion loss is measured by the network analyzer based upon the longitudinal sound wave (ultrasonic wave) generated inside the piezoelectric layer 23. Then the electromechanical coupling coefficient $k_t$ (or its squared value $k_t^2$) in the thickness vibration mode of the piezoelectric layer 23 is estimated by comparing the measured conversion loss with the theoretical curve simulated by Mason's equivalent circuit model.

In addition, FWHM of the X-ray rocking curve (XRC) of the piezoelectric layer 23 of each sample having a different composition ratio is measured. The FWHM value of XRC (hereinafter referred to as "XRC-FWHM") is an index of the c-axis orientation of the piezoelectric layer 23. The smaller the XRC-FWHM, the better the crystal orientation in the c-axis direction.

Figure 3:
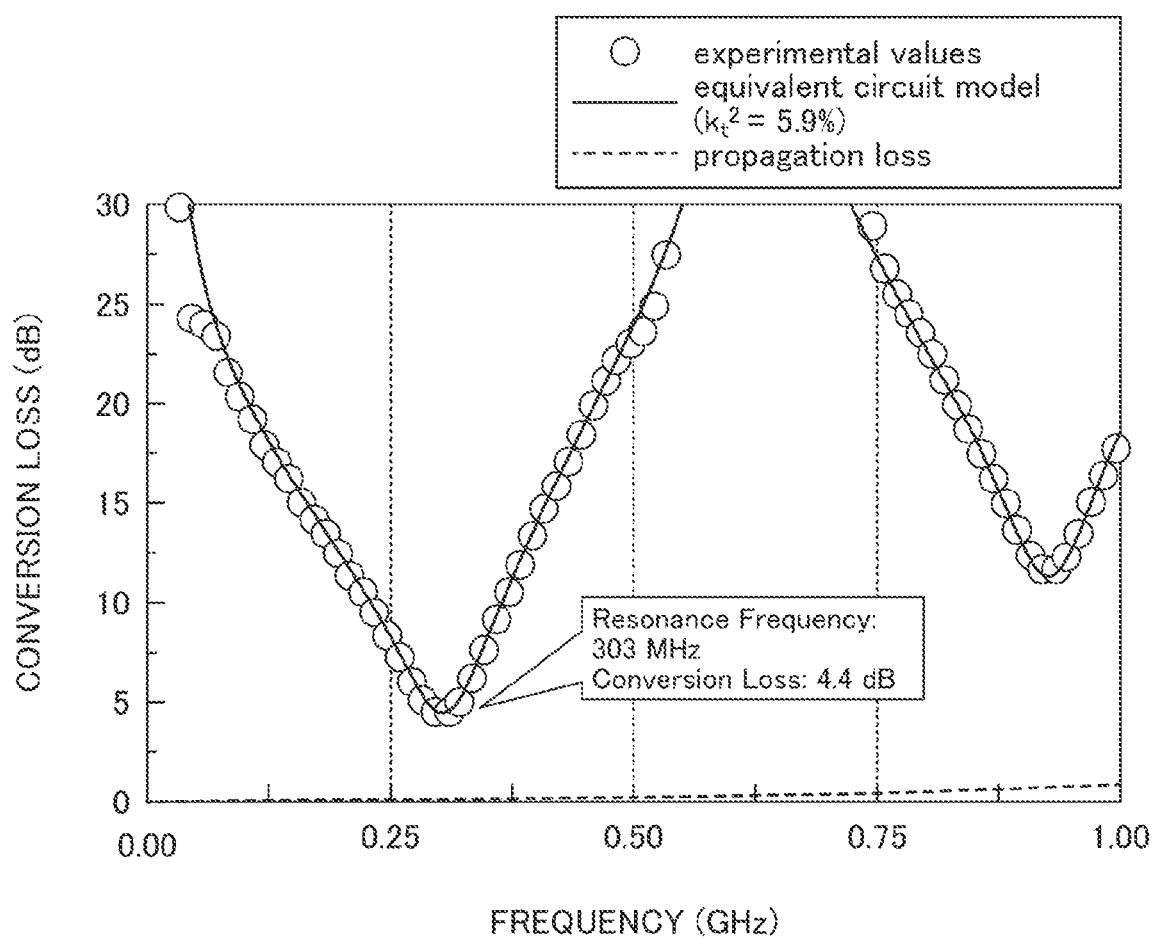
FIG. 3 shows the frequency dependence of conversion loss for obtaining a resonance frequency.

FIG. 3 shows the frequency dependence of the conversion loss of the reference sample with the pure ZnO piezoelectric layer 23 to which no dopant is added. The open circles represent the measured values, and the solid line is the theoretical curve simulated by Mason's equivalent circuit model. A dashed line with a very gentle slope near the horizontal axis of the chart indicates the propagation loss.

The conversion loss is expressed as the power ratio (dB) of the output frequency to the input frequency. Because the electromechanical coupling coefficient is expressed by the square root of the mechanical energy with respect to the supplied electric energy, the electromechanical coupling coefficient and the conversion loss correlate each other.

In FIG. 3, the experimental values of the open circles exhibit the same tendency as the calculated values from Mason's equivalent circuit model. Elastic resonance of the primary mode occurs at 303 MHz, and the conversion loss at this frequency is 4.4 dB. A semi-resonance occurs in the vicinity of 610 MHz where the conversion loss reaches the peak.

The smaller the conversion loss, and the farther the separation between resonance frequency and the semi-resonance frequency, the greater the electromechanical coupling coefficient kt in the thickness direction is. Assuming that the resonance frequency is "fr" and the semi-resonant frequency is "fa", the squared value $k_t^2$ of the electromechanical coupling coefficient is expressed by, for example, $$K_t^2=(\pi/2)(fr/fa)\cot[(\pi/2)(fr/fa)].$$

For all the other samples with dopants of different materials added at different ratios to ZnO, the resonance frequency at which the conversion loss becomes the minimum and the semi-resonant frequency indicating the peak of the conversion loss are similarly determined using the network analyzer, and the squared values ($k_t^2$) of the electromechanical coupling coefficient in the thickness of the piezoelectric layers 23 are estimated.

FIG. 4A shows the $k_t^2$ values when Mg is added as a dopant, compared with the $k_t^2$ value of pure ZnO without dopant added. The $k_t^2$ value of the undoped ZnO piezoelectric layer 23 is 5.9%. When adding Mg of 10 atom % with respect to the total of Zn and Mg, the $k_t^2$ value is improved to 7.3%. With Mg of 15 atom % with respect to the total of Zn and Mg, the $k_t^2$ value is 7.8%, and with Mg of 25 atom % with respect to the total Zn and Mg, the $k_t^2$ value is 7.3%.

The $k_t^2$ value increases by about 24% to 32%, compared with the pure ZnO without metal dopant added. It is understood from this analysis that, by adding Mg of 5 atom % to 30 atom %, the squared value $k_t^2$ of the electromechanical coupling coefficient in the thickness direction of the piezoelectric layer 23 can be improved. In particular, when the Mg content is 10 atom % to 25 atom %, the $k_t^2$ value increases to 120% or more, compared with the undoped ZnO.

FIG. 4B shows XRC-FWHM values and $k_t^2$ values measured while the Mg content in the piezoelectric layer is varied over a range broader than FIG. 4A. With the Mg content in the fabricated piezoelectric layer (relative to the total amount of Zn and Mg) ranging from 4.4 atom % to 20.0 atom %, the $k_t^2$ values are 7.3% or more, and sufficient resonance can be acquired. The XRC-FWHM values are also satisfactory 3.1° or less.

When the Mg content is 2.5%, the XRC-FWHM is good, but the $k_t^2$ value decreases to 6.0%. Meanwhile, when the doping ratio of Mg during film formation is 70 atom %, resonance could not be obtained and the $k_t^2$ value cannot be estimated.

By adding Mg in an appropriate composition range, the $k_t^2$ value increases nearly 40%, compared with pure ZnO without metal dopant added, and the XRC-FWHM can be maintained small. From FIG. 4B, the appropriate range of Mg contained in the piezoelectric layer is 4 atom % to 30 atom %, more preferably, 4 atom % to 20 atom %.

FIG. 5 shows $k_t^2$ value and XRC-FWHM when Ca is added as a dopant, compared with the $k_t^2$ value and the XRC-FWHM of the pure ZnO without dopant added. Similar to FIG. 4, the $k_t^2$ value of the undoped ZnO piezoelectric layer 23 is 5.9%, whereas the $k_t^2$ value increases to 6.8% by adding Ca of 0.9 atom % with respect to the total of Zn and Ca. With the Ca content of 1.1 atom % and 1.7 atom % with respect to the total of Zn and Ca, the $k_t^2$ value is 6.9%. When the Ca content with respect to the total amount of Zn and Ca is changed to 1.8 atom % and to 3.5 atom %, the $k_t^2$ values are 6.5 atom % and 6.3 atom %, respectively. Within this range of Ca content, the XRC-FWHM is as good as 3.0° or less.

On the other hand, when the Ca content is reduced to 0.4 atom %, the $k_t^2$ value decreases. When the Ca content is increased to 5.1 atom %, the XRC-FWHM is good, but the resonance generated is insufficient.

By setting the Ca content in the piezoelectric layer to 0.5 atom % to 5 atom %, the $k_t^2$ value is improved and the XRC-FWHM is reduced, compared with pure ZnO without metal dopant added. More preferably, by setting the Ca content to 0.8 atom % to 3.5 atom %, the $k_t^2$ value can be improved to about 110% to 118% of the pure ZnO without metal dopant, while reducing the XRC-FWHM. By adding Ca in the appropriate range, both the c-axis orientation and the electromechanical coupling coefficient of the thickness vibration mode are improved.

The fact that the electromechanical coupling coefficient of the thickness vibration mode is increased in FIGS. 4A, 4B, and 5 indicates that the piezoelectric characteristics of the piezoelectric device 10 of the embodiments are improved. By adding such a metal material that does not cause the zinc oxide-based sputtered film having a wurtzite crystal structure to exhibit conductivity, the squared value ($k_t^2$) of the electromechanical coupling coefficient of the thickness vibration mode can be increased to 6.3% or more, and more preferably, to 6.5% or more. The acquired $k_t^2$ values are increased by 1% to 25%, compared with the $k_t$-value of the undoped reference sample.

Modifications

Figure 6:
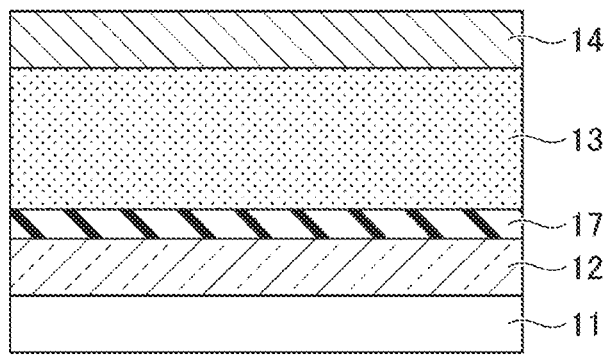
FIG. 6 is a schematic diagram of a modification of the piezoelectric device.

FIG. 6 is a schematic diagram of a piezoelectric device 10B, which is a modification of the piezoelectric device 10A. The piezoelectric device 10B has an orientation control layer 17 under the piezoelectric layer 13. The orientation control layer 17 is an amorphous layer provided to improve the c-axis orientation of the piezoelectric layer 13. The thickness of the orientation control layer 17 is 3 nm to 100 nm.

The orientation control layer 17 can be formed of an inorganic substance, an organic substance, or a mixture of an inorganic substance and an organic substance. As the inorganic substance, silicon oxide ($SiO_x$), silicon nitride (SiN), aluminum nitride (AlN), aluminum oxide ($Al_2O_3$), gallium nitride (GaN), gallium oxide ($Ga_2O_3$), and so on can be used. Alternatively, ZnO with $Al_2O_3$ and $SiO_x$ added (which is referred to as "SAZO" representing aluminum/silicon-added zinc oxide), or GaN, AlN, ZnO or other base material to which at least one of $Al_2O_3$, $Ga_2O_3$, $SiO_x$ and SiN is added can be used.

Examples of the organic substance include, but is not limited to, an acrylic resin, a urethane resin, a melamine resin, an alkyd resin, and a siloxane-based polymer. In particular, a thermosetting resin composed of a mixture of a melamine resin, an alkyd resin and an organic silane condensate can be preferably used as the organic substance. Using the above-described materials, an amorphous film can be formed by vacuum deposition, sputtering, ion plating, coating, or other appropriate methods. The orientation control layer 17 may be a single layer, or a multilayer with two or more films stacked. In the case of multilayer configuration, an inorganic thin film and an organic thin film may be laminated.

The amorphous orientation control layer 17 formed of the above-described materials is superior in surface smoothness, and the c-axis of the upper layer wurtzite crystal aligns vertical to the substrate (along the stacking direction). Further, the gas barrier performance is high. When a plastic substrate is used as the substrate 11, adverse influence of the gas generated from the plastic during the film formation process can be reduced. In particular, when the orientation control layer 17 is formed of a thermosetting resin, highly smooth amorphous layer is formed. When a melamine resin is used for the orientation control layer 17, the film density is high owing to the three-dimensional crosslinked structure and the barrier performance is good.

The orientation control layer 17 is not necessarily 100% amorphous, and it may contain a non-amorphous portion as long as the c-axis orientation of the piezoelectric layer 13 can be enhanced. The proportion of the amorphous part in the orientation control layer 17 is preferably 90% or more, and more preferably, 95% or more. In this case, sufficient degree of c-axis orientation control effect a, etc. are used as the wurtzite crystal, alkaline earth metals such as Mg, Ca, or Sr, or alternatively, metals of other groups such as V, Ti, Zr, Li, etc. can be added in a predetermined composition range.

When Mg is added as a dopant to ZnO, the Mg content with respect to the total of Zn and Mg in the film is 4 atom % to 30 atom %, and more preferably, 4 atom % to 20 atom %. When Ca is used as the dopant in ZnO, the Ca content with respect to the total of Zn and Ca in the film is 0.5 atom % to 5 atom %, and more preferably, 0.8 atom % to 3.5 atom %.

By doping Mg or Ca within above-described range, the electromechanical coupling coefficient of the thickness vibration mode can be improved, compared with undoped ZnO having a wurtzite crystal structure.

A metal other than Mg or Ca, such as V, Ti, Zr, Sr, or Li selected from the above-described metals, can also improve the piezoelectric characteristics in the thickness direction of the zinc oxide-based material having a wurtzite crystal structure. A mixture of the above-described metals may also be used as the dopant.

By providing the amorphous orientation control layer 17 as an underlayer, the c-axis orientation of the piezoelectric layer 13 is improved, and consequently, the piezoelectric characteristics of the piezoelectric device 10B are further improved.

Regarding the substrate 11, any material including glass, plastic, ceramic, and so on can be used. For the first electrode 12, any conductive material can be used. When light transmission is required depending on the applications, a transparent conductive film may be used. When light transmission is not required, a metal electrode may be used. In the configuration with a transparent electrode, the first electrode 12 may be formed of an amorphous oxide conductor.

Figure 7:
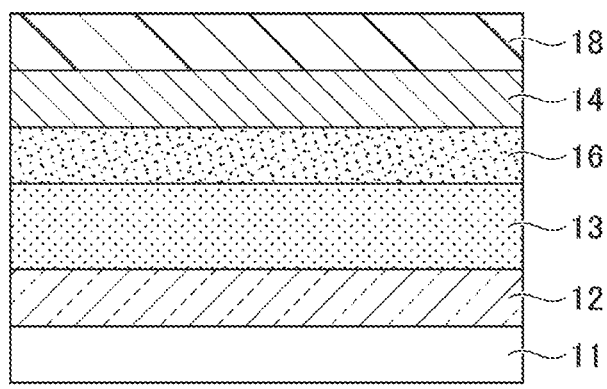
FIG. 7 is a schematic diagram of another modification of the piezoelectric device.

FIG. 7 is a schematic diagram a piezoelectric device 10C, which is another modification of the piezoelectric device 10A. In the piezoelectric device 10C, an adhesive layer 16 is provided at the interface between the piezoelectric layer 13 and the second electrode 14.

The piezoelectric layer 13 is formed of a wurtzite crystal material to which a metal dopant is added. The metal dopant is one that does not cause the piezoelectric layer 13 to exhibit conductivity when added. When ZnO, ZnS, ZnSe, ZnTe, or the like is used as the wurtzite crystal, alkaline earth metals such as Mg, Ca, or Sr, or alternatively, metals of other group such as V, Ti, Zr, Li, etc. may be added in a predetermined composition range.

When Mg is added as a dopant to ZnO, the Mg content with respect to the total of Zn and Mg in the film is 4 atom % to 30 atom %, and more preferably, 4 atom % to 20 atom %. When Ca is used as the dopant in ZnO, the Ca content with respect to the total of Zn and Ca in the film is 0.5 atom % to 5 atom %, and more preferably, 0.8 atom % to 3.5 atom %. By doping Mg or Ca within the above-described range, the electromechanical coupling coefficient of the thickness vibration mode can be improved, compared with undoped ZnO having a wurtzite crystal structure.

The adhesive layer 16 suppresses leakage current paths caused by cracks or pinholes produced in the piezoelectric layer 13. When metal grain boundaries or protrusions exist at the interface between the piezoelectric layer 13 and the first electrode 12, or at the interface between the piezoelectric layer 13 and the second electrode 14, a leakage current path will be formed between the electrodes due to cracking or the like. Such leakage current path extinguishes the polarization. By inserting the adhesive layer 16, occurrence of leakage current paths is suppressed, and the piezoelectric characteristics of the piezoelectric layer 13 are maintained satisfactory.

The manufacturing process for the piezoelectric device 10C is as follows. As a first part of the device, the first electrode 12 is formed on the substrate 11, and the piezoelectric layer 13 to which a metal dopant is added at a predetermined ratio is formed on the first electrode 12.

Meanwhile, a second electrode 14 is formed on a substrate 18 to provide a second part of the device. Any material can be used as the substrate 18, and for example, a plastic substrate may be used. The piezoelectric layer 13 and the second electrode 14 are brought so as to face each other, and the first part and the second part are bonded together with the adhesive layer 16. Thus, the multilayer structure of the piezoelectric device 10C is fabricated.

The piezoelectric device 10C has a large electromechanical coupling coefficient of the thickness vibration mode, while preventing leakage current paths from occurring between the electrodes, and it has good piezoelectric characteristics.

A piezoelectric device 10 according to the invention is not limited to a device that utilizes the piezoelectric effect, such as a force sensor for a touch panel, a pressure sensor, an acceleration sensor, or an acoustic emission sensor, but is also applicable to a speaker, a transducer, a high frequency filter device, or the like that utilizes the inverse piezoelectric effect. In the latter case, the conversion efficiency from electrical energy to mechanical energy is high, and large deformation is created in the thickness direction.

The configuration of the piezoelectric device 10 is not limited to the above-described examples of piezoelectric devices 10A to 10C. In the configurations of FIG. 6 and FIG. 7, the second electrode 14 may be formed as a transparent conductive film. The configurations of FIG. 6 and FIG. 7 may be combined, such that the orientation control layer 17 may be inserted between the piezoelectric layer 13 and the first electrode 12, and that the piezoelectric layer 13 and the second electrode 14 are bonded together by the adhesive layer 16. In this case, the first part is fabricated by forming the first electrode 12 on the substrate 11, then forming the orientation control layer 17 on the first electrode 12, and then forming the piezoelectric layer 13 to which a selected dopant is added at a predetermined ratio on the orientation control layer 17. Meanwhile, the second part is fabricated by forming the second electrode 14 on the substrate 18. The piezoelectric layer 13 and the second electrode 14 are brought so as to face each other, and bonded together by the adhesive layer 16.

In either case, the piezoelectric layer 13 has good piezoelectric characteristics in the thickness direction, and satisfactory conversion efficiency can be achieved.

When ZnO is used as the main component of the piezoelectric layer 13, a mixture of Mg and Ca may be added to the ZnO.

LISTING OF SYMBOLS 10, 10A to 10C: piezoelectric device
11: substrate
12: first electrode (first electrode layer)
13: piezoelectric layer
14: second electrode (second electrode layer)
16: adhesive layer

PRIOR ART DOCUMENT(S)

Patent Document 1: Japan Patent No. 6273691
Patent Document 2: Japanese Patent Application Laid-open Publication No. H8-310813

What is claimed is:

1. A piezoelectric device comprising:
a substrate having a surface;
a first electrode layer;
a second electrode layer;
a piezoelectric layer over the substrate and between the first electrode layer and the second electrode layer; and
an amorphous orientation control layer between the piezoelectric layer and the substrate,
wherein the piezoelectric layer is formed of a ZnO-based material having a wurtzite crystal structure to which a metal that does not cause the piezoelectric layer to exhibit conductivity is added,
wherein the piezoelectric layer has crystal orientation in a c-axis direction,
wherein the c-axis direction is perpendicular to the surface of the substrate, and
wherein a squared value of an electromechanical coupling coefficient in thickness vibration mode is 6.5% or more.

2. The piezoelectric device as claimed in claim 1, wherein a full width at half maximum of an X-ray locking curve of the piezoelectric layer is 5° or less.

3. The piezoelectric device as claimed in claim 1, wherein the substrate is a quartz substrate or a glass substrate.

4. The piezoelectric device as claimed in claim 1, wherein the substrate is a plastic substrate.

5. The piezoelectric device as claimed in claim 4,
wherein the amorphous orientation control layer being-is formed of an inorganic material, an organic material, or a mixture of the inorganic material and the organic material,
wherein the inorganic material is a compound selected from a group consisting of silicon oxide ($SiO_x$), silicon nitride (SiN), aluminum nitride (AlN), aluminum oxide ($Al_2O_3$), gallium nitride (GaN), gallium oxide ($Ga_2O_3$), and aluminum/silicon-added zinc oxide (SAZO), and
wherein the organic material is a material selected from a group consisting of acrylic resin, urethane resin, melamine resin, alkyd resin, and siloxane-based polymer.

6. The piezoelectric device as claimed in claim 1, further comprising an adhesive layer provided between the piezoelectric layer and the second electrode layer.

7. The piezoelectric device as claimed in claim 6, further comprising a second substrate on the second electrode layer.

8. The piezoelectric device as claimed in claim 1, wherein the substrate is comprises a plastic material.

9. The piezoelectric device as claimed in claim 8, wherein the amorphous orientation control layer comprises an inorganic material.

10. The piezoelectric device as claimed in claim 8, wherein the amorphous orientation control layer comprises an organic material.

11. The piezoelectric device as claimed in claim 8, wherein the amorphous orientation control layer comprises an inorganic material and an organic material.

12. A piezoelectric device comprising:
a substrate having a surface;
a first electrode layer;
a second electrode layer;
a piezoelectric layer over the substrate and between the first electrode layer and the second electrode layer; and
an amorphous orientation control layer between the piezoelectric layer and the substrate,
wherein the piezoelectric layer is formed of a ZnO-based material having a wurtzite crystal structure to which Mg is added,
wherein the piezoelectric layer has crystal orientation in a c-axis direction,
wherein the c-axis direction is perpendicular to the surface of the substrate, and
wherein a Mg content with respect to a total amount of Zn and Mg is 4 atom % to 30 atom %.

13. The piezoelectric device as claimed in claim 12, wherein the Mg content with respect to the total amount of Zn and Mg is 5 atom % to 30 atom %.

14. The piezoelectric device as claimed in claim 12, wherein a full width at half maximum of an X-ray locking curve of the piezoelectric layer is 5° or less.

15. The piezoelectric device as claimed in claim 12, wherein the substrate is a quartz substrate or a glass substrate.

16. The piezoelectric device as claimed in claim 12, wherein the substrate is a plastic substrate.

17. The piezoelectric device as claimed in claim 12, further comprising an adhesive layer provided between the piezoelectric layer and the second electrode layer.

18. A piezoelectric device comprising:
a substrate having a surface;
a first electrode layer;
a second electrode layer;
a piezoelectric layer provided between the first electrode layer and the second electrode layer; and
an amorphous orientation control layer between the piezoelectric layer and the substrate,
wherein the piezoelectric layer is formed of a ZnO-based material having a wurtzite crystal structure to which Ca is added,
wherein the piezoelectric layer has crystal orientation in a c-axis direction,
wherein the c-axis direction is perpendicular to the surface of the substrate, and
wherein a Ca content with respect to a total amount of Zn and Mg is 0.5 atom % to 5 atom %.

19. The piezoelectric device as claimed in claim 18, wherein a full width at half maximum of an X-ray locking curve of the piezoelectric layer is 5° or less.

20. The piezoelectric device as claimed in claim 18, wherein the substrate is a quartz substrate or a glass substrate.

21. The piezoelectric device as claimed in claim 18, wherein the substrate is a plastic substrate.

22. The piezoelectric device as claimed in claim 18, further comprising an adhesive layer provided between the piezoelectric layer and the second electrode layer.

23. A method of manufacturing a piezoelectric device, the method comprising:
forming an amorphous orientation control layer over first electrode, the first electrode being over a substrate having a surface;
forming a piezoelectric layer of a ZnO-based material having a wurtzite crystal structure over the amorphous orientation control layer by sputtering, wherein the piezoelectric layer has crystal orientation in a c-axis direction, and the c-axis direction is perpendicular to the surface of the substrate; and
providing a second electrode on the piezoelectric layer in a stacking direction,
wherein during the sputtering, a metal that does not cause the piezoelectric layer to exhibit conductivity is added such that a squared value of an electromechanical coupling coefficient in thickness vibration mode of the piezoelectric layer is 6.5% or more.

24. The method as claimed in claim 23, further comprising:
bonding the piezoelectric layer and the second electrode by an adhesive layer.

25. A method of manufacturing a piezoelectric device, the method comprising:
forming an amorphous orientation control layer over first electrode, the first electrode being over a substrate having a surface;
forming a piezoelectric layer of a ZnO-based material having a wurtzite crystal structure over the amorphous orientation control layer by sputtering, wherein the piezoelectric layer has crystal orientation in a c-axis direction, the c-axis direction is perpendicular to the surface of the substrate, and the ZnO-based material is doped with Mg; and
providing a second electrode on the piezoelectric layer in a stacking direction,
wherein a Mg content with respect to a total amount of Zn and Mg of the piezoelectric layer formed by the sputtering is 4 atom % to 30 atom %.

26. The method as claimed in claim 25, wherein the Mg content with respect to the total amount of Zn and Mg of the piezoelectric layer formed by the sputtering is 5 atom % to 30 atom %.

27. The method as claimed in claim 25, further comprising:
bonding the piezoelectric layer and the second electrode by an adhesive layer.

28. A method of manufacturing a piezoelectric device, the method comprising:
forming an amorphous orientation control layer over first electrode, the first electrode being over a substrate having a surface;
forming a piezoelectric layer of a ZnO-based material having a wurtzite crystal structure over the amorphous orientation control layer by sputtering, wherein the piezoelectric layer has crystal orientation in a c-axis direction, the c-axis direction is perpendicular to the surface of the substrate, and the ZnO-based material is doped with Ca; and
providing a second electrode on the piezoelectric layer in a stacking direction,
wherein a Ca content with respect to a total amount of Zn and Ca of the piezoelectric layer formed by the sputtering is 0.5 atom % to 5 atom %.

29. The method as claimed in claim 28, further comprising:
bonding the piezoelectric layer and the second electrode by an adhesive layer.

* * * * *

UNITED STATES PATENT AND TRADEMARK OFFICE
CERTIFICATE OF CORRECTION

| | | |
|---|---|---|
| PATENT NO. | : 12,382,836 B2 | Page 1 of 1 |
| APPLICATION NO. | : 17/279054 | |
| DATED | : August 5, 2025 | |
| INVENTOR(S) | : Daisuke Nakamura et al. | |

It is certified that error appears in the above-identified patent and that said Letters Patent is hereby corrected as shown below:

In the Claims

Claim 5, Column 10, Line 23, "wherein the amorphous orientation control layer being-is" should be changed to -- wherein the amorphous orientation control layer is --, and Claim 8, Column 10, Line 41, "the substrate is comprises a plastic material." should be changed to -- the substrate comprises a plastic material. --.

Signed and Sealed this
Fourth Day of November, 2025

John A. Squires
*Director of the United States Patent and Trademark Office*